US006978392B2

(12) United States Patent
Fernandez et al.

(10) Patent No.: US 6,978,392 B2
(45) Date of Patent: Dec. 20, 2005

(54) ENABLE PROPAGATION CONTROLLER

(75) Inventors: Virgilio A. Fernandez, Gilbert, AZ (US); David W. Feldbaumer, Chandler, AZ (US); Darren V. Weninger, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 630 days.

(21) Appl. No.: 10/044,563

(22) Filed: Jan. 11, 2002

(65) Prior Publication Data
US 2003/0135777 A1   Jul. 17, 2003

(51) Int. Cl.[7] ............................................. G06F 1/06
(52) U.S. Cl. .................. 713/501; 713/600; 365/185.17
(58) Field of Search ............................... 713/500, 501, 713/503, 600; 714/724, 725, 726, 731; 365/185.17, 365/201

(56) References Cited

U.S. PATENT DOCUMENTS

| | | | | |
|---|---|---|---|---|
| 3,848,230 A | * | 11/1974 | Rehm et al. | ............ 340/825.21 |
| 4,763,252 A | * | 8/1988 | Rose | ........................... 345/168 |
| 4,833,655 A | * | 5/1989 | Wolf et al. | .................. 365/221 |
| 4,941,113 A | * | 7/1990 | Dundics et al. | ............... 702/83 |
| 5,255,239 A | * | 10/1993 | Taborn et al. | .............. 365/221 |
| 5,845,080 A | * | 12/1998 | Hamada et al. | ............. 709/224 |
| 5,889,979 A | * | 3/1999 | Miller et al. | ................. 713/503 |
| 6,073,254 A | | 6/2000 | Whetsel | |
| 6,795,944 B2 | * | 9/2004 | Barnhart | ..................... 714/726 |

OTHER PUBLICATIONS

PCT International Search Report.

* cited by examiner

*Primary Examiner*—Thuan Du

(57) ABSTRACT

An enable propagation controller employed in an integrated circuit operates in either a sequence manager mode or a transparent mode. When operating in the sequence manager mode, the enable propagation controller allows a set of signals intended to enable either a set of transmission or a set of reception signals to pass through to their corresponding transmission or receptions sub-circuits. Each of the signals in the desired set is allowed to pass through in a predetermined sequence and for a predetermined duration that may or may not be influenced by a set of control bits received by the enable propagation controller. When operating in a transparent mode, all enable signals are allowed to pass through to corresponding intended sub-circuits.

19 Claims, 3 Drawing Sheets

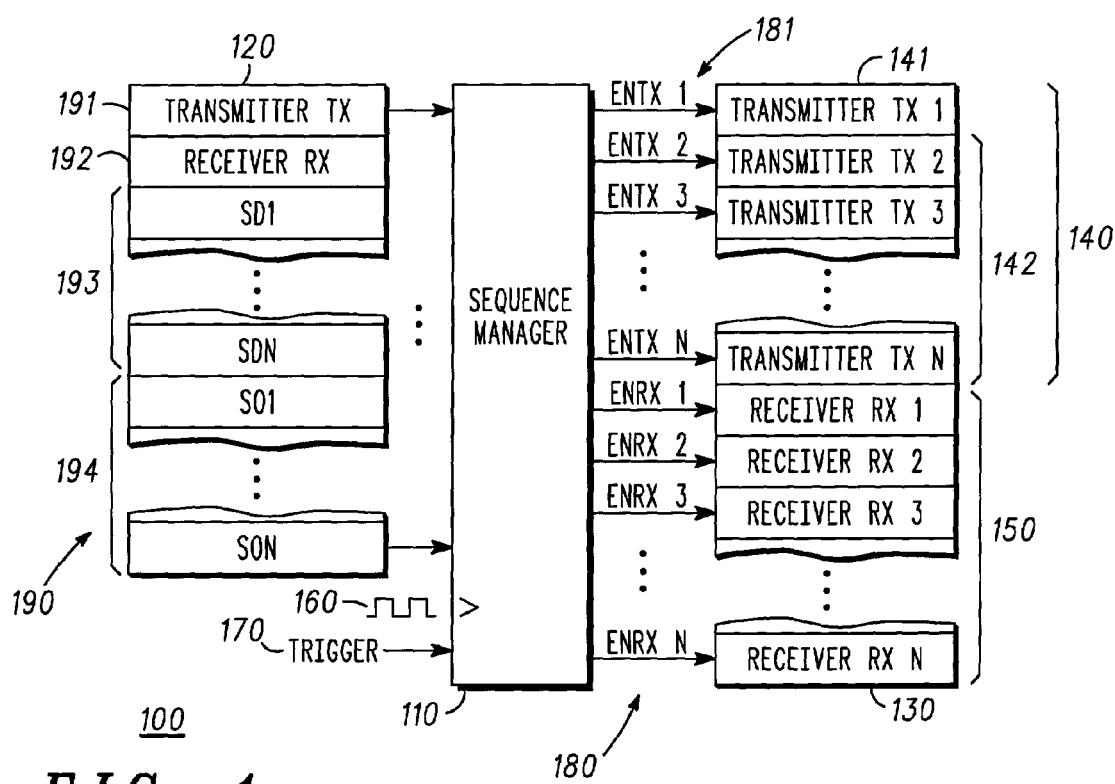

| TX ENABLE | RX ENABLE | SMEN/EPC' | SD | | | | | SO | | | | | ENABLE TX | | | | | ENABLE RX | | | | |
|---|---|---|---|---|---|---|---|---|---|---|---|---|---|---|---|---|---|---|---|---|---|---|
| | | | 1 | 2 | 3 | ... | N | 1 | 2 | 3 | ... | N | N1 | 2 | 3 | ... | N | N1 | 2 | 3 | ... | N |
| 0 | 1 | 1 | 0 | 0 | 0 | ... | 1 | 0 | 0 | 1 | ... | 1 | 1 | 1 | 1 | ... | 1 | 1 | 1 | 0 | ... | 0 |
| X | X | 0 | X | X | X | ... | X | X | X | X | ... | X | X | 1 | 1 | ... | 1 | 1 | 0 | 0 | ... | 0 |

ENABLE PROPAGATION CONTROLLER

FIELD OF THE INVENTION

The present invention relates, in general to Electronic Control Mechanisms designed for use in portable transceivers and, more particularly, to a timed warm-up and warm-down of analog and digital components in sequences that reduce power surges and consumption while also providing a mechanism for individually testing these analog and digital components during a test mode.

BACKGROUND OF THE INVENTION

Sequence Managers are widely used for controlling the sequencing and duration during runtime of components on mixed-mode (i.e. analog and digital) IC's, such as transceivers, used in portable devices. When the sequence manager receives a transmit/receive trigger, it enables various components for various durations according to a pre-programmed sequence in order to reduce power drain on the transceiver IC as a whole, allowing for reduced battery consumption and preventing component error due to noise spikes. Additionally, sequence managers help reduce power surges caused by warm-up and warm-down of the various components that need to be enabled for a particular operation such as transmitting or receiving data.

Prior art sequence managers are designed to allow a minimum amount of control of the sequence process by allowing some control signals to be written into on-chip memory. These control signals allow the user to manipulate the duration between enabling some of the components or sub-blocks as well as allow limited control over the enabling sequence order. To simplify the implementation, conventional sequence managers are developed with certain restrictions as to what the user can program in order to make sure sub-blocks are properly enabled.

Because of these limitations, testing of sub-blocks controlled by the sequence manager is cumbersome. A user cannot gain full control of an individual sub-block and must efficiently utilize the control signals to gain the best available testing conditions for any given sub-block. This requires extensive knowledge of all sub-blocks and their interactions. Additionally, even by optimizing the test conditions by properly programming the control signals, complete control of the on-chip components cannot be achieved because the sequence manager has built-in limitations on control flexibility. What is needed is a sequence manager that allows for testing individual sub-blocks and allows for complete individual control of the sub-blocks for testing purposes while also allowing for greater sequence management control during normal operation.

BRIEF DESCRIPTION OF THE DRAWINGS

FIG. 1 is a block diagram representing a conventional sequence manager.

FIG. 2 is an example of a memory instruction written to the on-chip programmable memory that feeds the conventional sequence manager of FIG. 1.

FIG. 3 is a timing diagram that demonstrates a possible enabling sequence caused by the sequence manager in accordance with programmed memory demonstrated in FIG. 2.

FIG. 5 demonstrates examples of enable and control bits written to the programmable memory and used by the enable propagation controller in accordance with the invention.

DETAILED DESCRIPTION OF THE DRAWINGS

Figure 4:
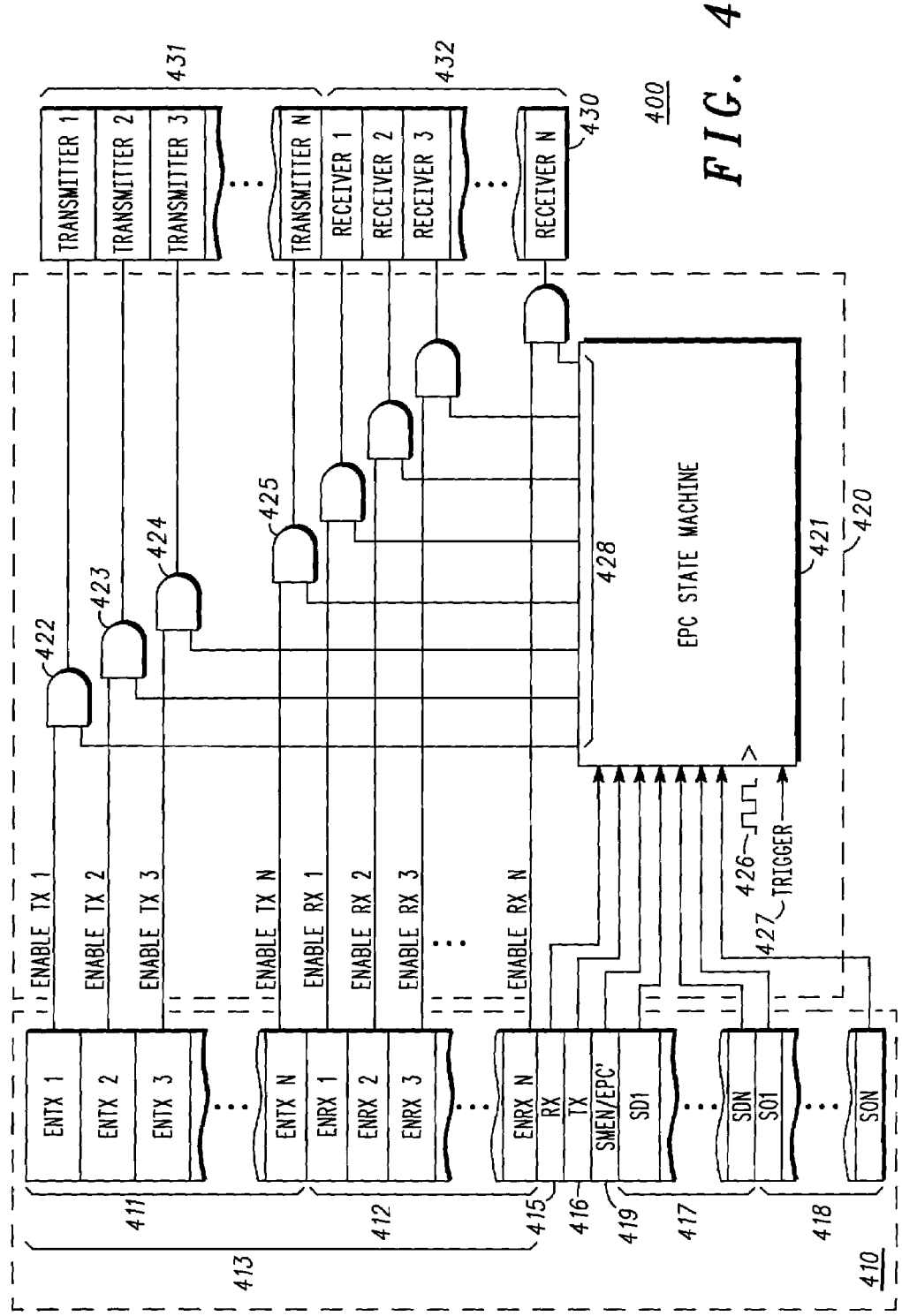
FIG. 4 is a schematic diagram representing the invention according to one embodiment.

FIG. 1 is a block diagram of a conventional sequence manager in a mixed-mode device, such as a transceiver. The mixed mode system 100 includes a sequence manager ("SM") 110, a programmable memory 120 and a plurality of mixed-mode sub-blocks 130 that can be either analog or digital sub-components. The mixed-mode sub-blocks 130 typically include transmitting components TX1 . . . TXN 140 and receiving components RX1 . . . RXN 150 generally implemented in a transceiver IC device such as band-pass filters, limiters, low noise amplifiers, and etc.

Sequence Manager ("SM") 110 receives a reference clock signal 160 and a trigger signal 170. Upon receiving the trigger signal 170, the sequence manager produces a sequence of enable signals ENTX1 . . . ENTXN and ENRX1 . . . ENRXN 180, each corresponding to and enabling their corresponding sub-block 130. The majority of the sequence, timing and duration of the enable signals produced by SM 110 are predetermined by hard wired SM 110 logic (not shown) along with some variable programming provided by control signals 190 stored in the programmable memory 120. The programmable memory 120 usually resides on the mixed mode system 100 with the sequence manager 110 and the various analog and digital sub-blocks 130.

The programmable memory 120 allows a user employing the transceiver IC device to write limited instructions to the memory for controlling the sequence manager. These instructions typically are written to the memory through an interface such as a serially programmable interface ("SPI"). Conventional designs allow for a Transmit Enable ("Txen") 191, a Receive Enable ("Rxen") 192, a plurality of sequence duration control signals ("SD1 . . . SDN") 193, and a plurality of sequence order control signals ("SO1 . . . SON") 194. Txen 191 allows the user to control when the transceiver IC device should transmit; Rxen 192 allows the user to control when the transceiver IC device should receive; while SD1 . . . SDN 193 and SO1 . . . SDN 194 allow the user to control, on a limited basis, the duration for a predetermined sub-block should be enabled and the enabling or disabling sequence of predetermined sub-blocks, respectively. Because of sheer quantity and potential variation in how many sub-blocks 130 are implemented on the transceiver IC device 100, the logic required in the sequence manager to allow for complete control of the sequence and duration of the sub-blocks is prohibitive. This is understood by imagining the complexity of allowing a user to write control sequences for a large finite number of intervals, such as N, requiring at least 2N number of logic components. As sub-blocks and/or allowed intervals increase, the size of the sequence manager becomes prohibitively expensive and power consumption increases. Consequently, every sequence manager is designed to allow just limited amount of sequence and duration control by the user through the control signals contained in the memory 120.

The SM 110, when it receives a trigger signal 170 determines whether either Txen 191 or Rxen 192 control bit is set to an ON state, represented by a logical "1" in this example. If Txen is set to "1", the SM 110 utilizing the hardwired internal control logic along with the limited amount of control variation allowed through the control bits SD1 . . . SDN 193 and SO1 . . . SDN 194 provides enable signals ENTX1 . . . ENTXN 181 to sequentially enable all transmit sub-blocks TX1 . . . TXN 140 in a predetermined sequence and duration. Because all transmit sub-blocks 140 associated with a general Transmit control signal 191 are required to be enabled at some point in the transmit sequence (each having been hard-wired to be enabled if Txen 191 is a logical "1"), there is no mechanism for a user to enable or disable a single transmit sub-block 141. This limitation makes it very onerous for designers of individual sub-block components of the transceiver IC device to test the sub-block they are responsible for testing. If a designer for Sub-block TX1 141 wishes to test this sub-block, he would need to replace the sequence manager with a hardwired solution specifically designed to test the individual sub-block. Because the Sequence Manager and the sub-blocks are often located on a single transceiver IC device that is very small, providing the hard-wired logic required to test an individual sub-block is very difficult and expensive. Alternatively, a designer specializing in the circuitry of sub-block TX1 141 would be required to understand the interplay and workings of each of the other sub-blocks TX2 . . . TXN 142 with sub-block TX1 141.

FIG. 2 shows an example of an instruction written to memory 120 through a SPI or other interface while FIG. 3 shows a corresponding timing diagram of various enable signals 181 after the SM 110 receives an activating trigger 170. In FIG. 2, the instruction 210 written to memory contains a transmit control bit 220, a receive control bit 230, a plurality of sequence duration control bits 240, and a plurality of sequence ordering bits 250. In this example, the transmit bit 220 is turned on, while the receive bit is disabled 230. The duration control bits in this example SM 110 allow the user to program whether TX1 is enabled for a first duration or a second duration where the first duration and the second duration vary by a predetermined amount. Additionally, the SO control bits SO1 . . . SON in this example allow the user employing the transceiver IC device to program whether sub-block TXN is enabled before TX3. As the specific bit sequence used to control the duration and order are arbitrary based on the design logic hardwired in the SM 110, they are not specifically shown. Rather, it is to be understood for this example that the user has written an instruction informing TX1 to be enabled for a predefined and allowable duration and that sub-block TXN is to be enabled before TX3.

Accordingly, upon the SM 110 receiving a trigger signal 170 at time t0 of FIG. 3, the SM 110 executes a transmission sequence according to the control bits contained in memory. Accordingly, SM 110 begins enabling transmission sub-blocks sequentially based on the predetermined hardwired logic embedded in the SM 110. In this case, Sub-block TX1 is enabled at time T1, sub-block TX2 is enabled some time later at T2, where T2-T1 is controlled by the SM 110. Similarly, TX3 is enabled at T4, sometime after TXN was enabled because the instruction written to memory required TXN to be enabled before TX3. For some duration, from time T4 to time T6, all transmission sub-blocks are enabled allowing the transceiver to transmit according to its design specifications. This duration although functional during the normal operation of a transceiver device inhibits individual sub-block testing making it extremely cumbersome for a designer to individually toggle or control the sub-block for testing the sub-block's integrity. Assume for illustration only that the transmission is complete at time t5. After the transmission is complete, the trigger 170 is disabled and the SM 110 disables in a predetermined sequence each of the transmission sub-blocks 140, and the SM rests until receiving another trigger signal.

FIG. 4 is a block diagram of one embodiment according to the invention. In this embodiment, a transceiver mixed-mode IC device 400 includes a programmable memory 410, an enable propagation controller ("EPC") 420 and a plurality of digital and/or analog transmission and reception sub-blocks 430. In addition to allowing the user employing the transceiver IC device 400 to write Rx 415, Tx 416, and some sequence duration and order control SD1 . . . SDN 417 and SO1 . . . SON 418 respectively, the invention also allows a user to provide on or off enable signals ENTX1 . . . ENTXN 411 and ENRX1 . . . ENRXN 412, each corresponding to a respective sub block TX1 . . . TXN 431 or RX1 . . . RXN 432, and a control bit SMEN/EPC' 419 for determining whether the EPC 420 is in a first or sequence manager mode or a second or enable propagation mode. The sequence manager mode allows the EPC 420 to function like a conventional sequence manager with the added control of the user being able to control whether each individual sub-block will or will not be enabled during a predetermined enabling sequence, while the enable propagation mode causes the EPC 420 to essentially become transparent, allowing each and every one of the memory enable signals 413, whether in an ON or OFF state, to pass through to their individual respective sub-blocks.

Enable propagation controller 420 includes a state machine 421 (or other control logic) and a plurality of logic gates such as logic gates 422–425. The state machine 421 receives a reference clock signal 426, a trigger signal 427, and the control signals from the programmed memory 415–419. The EPC 420 produces signals 428 that control whether, at what time and for what duration the logic gates such as logic gates 422–425 allow their received memory programmed enable signal inputs to pass through to their respective sub-blocks 430. A logic gate is "activated" when the enable signal it receives is allowed to pass through to its desired destination. If the state machine or control logic (or other control logic) 421 receives a control signal indicating that the EPC 420 is to operate in a sequence manager mode, i.e. SMEN/EPC' is a logical "1", then the state machine 421 allows all logic gates such as gates 422–425 to pass through their respective programmed enable input signals in a sequence and for a duration that has been predetermined and hard-wired into the state machine, allowing some limited control through control bits 417 and 418. Although the EPC 420 provides the same capability as conventional sequence managers during a sequence manager mode operation, it further provides the flexibility that a user may program individual or combinations of memory enables 413 to not enable a corresponding sub-block when the state machine 421 causes the enable signal to pass through according to the sub-block's predetermined sequence and duration. To operate in the limited fashion of a conventional sequence manager, a user would write all logical ones to the enable memory bits 413 and write a logical one to the SMEN/EPC' control bit. Although logical ones represent an on state in this example, it should be noted that any logical scheme is contemplated.

Alternatively, if the state machine 421 receives a control signal indicating that the EPC 420 is to operate in an enable propagation or transparent mode, i.e. SMEN/EPC' is a logical "0", then the state machine forces all logic gates such as gates 422–425 to pass through their respective enable input signals regardless of timing and control signals stored in memory. In this mode, the invention allows a user to control each sub-block at his own discretion directly through programmable memory without worrying about built-in sequence and duration limitations associated with the sequence manager mode. This mode provides two distinct benefits. First, it allows the creation of custom sequences differing from those dedicated by the hardware in sequence manager mode. This is accomplished by configuring the EPC in transparent mode, and programming the memory locations corresponding to ENTX1 ... ENTXN for transmit or ENRX1 ... ENRXN for receive in a desired order with desired durations between them. This feature allows the user to experiment and optimize the sequences for best operation. Secondly, this mode allows complete control for a designer to test his individually designed sub-block removing any need for knowledge of other sub-blocks removing the necessity for creating new testing sequence and duration logic control conventionally required during testing trials.

FIG. 5 demonstrates two instructions written to memory. In the first instruction 510, SMEN/EPC' is programmed to a logical "1" putting the EPC 420 into a sequence manager mode. However, because the invention's sequence manager mode allows individual enable bits to be controlled, a designer may decide to not enable sub-block RX3 for instance. Accordingly, ENRX3 could be initially programmed to "0". The clock may then be stopped after a warm-up sequence so that all other receiving devices are enabled and the RX3 can be toggled on and off so its characteristics can be accurately observed. Of course, the reference clock can be programmed to self-gate after warm up such that once warm-up is complete, but before the trigger is removed indicating the commencement of a warm-down, the EPC's clock is stopped to reduce noise generation during actual data transmission or reception.

A second instruction 520 is demonstrated where the EPC 420 is instructed to be in a transparent mode, i.e. SMEN/EPC' is programmed to a logical "0". In this case, the control bits TX, RX, SD and SO have no effect because the state machine substantially simultaneously forces each of the logic gates to allow their respective signals to pass through. In this case, a designer can manipulate any sub-block individually or in groups as desired to fully test his sub-block. This is accomplished by simply changing the logical value of the enable signals stored in the programmable memory. As this mode is generally used only in testing environments where power consumption is not an issue, enabling all sub-blocks or any combination of sub-blocks is not problematic.

It should be appreciated that an enable propagation controller has been disclosed that provides a mechanism for easily testing individual sub-blocks controlled by the enable propagation controller.

In the foregoing specification the invention has been described with reference to specific exemplary embodiments thereof. It will, however, be evident that various modifications and changes may be made thereto without departing from the broader spirit and scope of the invention. For example, the present invention may be used with sub-modules are not mixed modes, and could be similar sub-blocks and other logic combination can be used in place of logic shown. The specification and drawings are, accordingly, to be regarded in an illustrative rather than restrictive sense. Moreover, the following claims indicate the scope of the invention, and all variations that come within the meaning and range of equivalency of the claims are to be embraced within their scope.

What is claimed is:

1. An enable propagation control circuit comprising:
   control logic receiving a plurality of control signals, a reference clock signal and a trigger signal and generating a plurality of pass through control signals; and
   a plurality of logic gates, each receiving one of the plurality of pass through control signals and an input enable signal and generating an output enable signal equivalent in logical value to the input enable signal when activated,
   wherein receiving a plurality of control signals includes receiving a mode control signal, wherein the mode control signal determines whether the enable propagation control circuit operates in a sequence manager mode or a transparent mode, and wherein the transparent mode causes the plurality of pass through control signals to simultaneously activate all of the plurality of logic gates.

2. The enable propagation control circuit of claim 1 further comprising a programmable memory, coupled to the control logic, said programmable memory providing the plurality of control signals to the control logic.

3. The enable propagation control circuit of claim 2, wherein the programmable memory stores the input enable signal for each of the plurality of logic gates.

4. The enable propagation control circuit of claim 1, wherein the sequence manager mode causes the plurality of pass through control signals to activate each of a portion of the plurality of logic gates in a sequence and for a duration.

5. The enable propagation control circuit of claim 4, wherein the sequence and the duration are predetermined.

6. The enable propagation control circuit of claim 4, wherein the portion is determined by one of the plurality of control signals.

7. The enable propagation control circuit of claim 4, wherein the sequence and the duration are determined according to the plurality of control signals constrained by internal logic.

8. A The enable propagation control circuit of claim 1, wherein the sequence manager mode and the transparent mode are determined by a control bit.

9. The enable propagation control circuit of claim 8, wherein the control bit is writable.

10. A transceiver integrated circuit device comprising:
    a programmable memory receiving and storing a plurality of control signals and a plurality of enable signals;
    an enable propagation control circuit comprising control logic receiving the plurality of control signals from the programmable memory, a reference clock signal and a trigger signal and generating a plurality of pass through control signals; and a plurality of logic gates, each receiving one of the plurality of pass through control signals and an input enable signal from the plurality of enable signals and generating an output enable signal equivalent in logical value to the input enable signal when activated; and
    a plurality of sub-blocks, each corresponding to one of the plurality of logic gates and receiving the output enable signal associated with the one of the plurality of logic gates.

11. An integrated circuit device as in claim 10, wherein receiving the plurality of control signals includes receiving a mode control signal, wherein the mode control signal determines whether the enable propagation control circuit operates in a sequence manager mode or a transparent mode, and wherein the transparent mode causes the plurality of pass through control signals to simultaneously activate all of the plurality of logic gates.

12. An integrated circuit comprising
   a plurality of control inputs receiving a plurality of control signals;
   a plurality of enable inputs receiving a corresponding plurality of enable signals;
   a plurality of enable outputs delivering a plurality of enable outputs;
   a clock input receiving a clock signal; and
   a trigger input receiving a trigger signal, wherein the circuit, in a first mode and upon receiving the trigger signal, propagates each of a portion of the plurality of enable signals to a respective enable output in a sequence and for a duration, and wherein the circuit, in a second mode, propagates all of the plurality of enable signals to their respective enable outputs.

13. The circuit of claim 12 wherein the portion is determined by one of the plurality of control signals.

14. The circuit of claim 12, wherein die sequence and duration are determined by a portion of the plurality of control signals constrained by logic circuitry.

15. The circuit of claim 12, wherein the first mode and the second mode are determined by one of the plurality of control signals.

16. An integrated circuit as in claim 12, further comprising a programmable memory, said programmable memory storing the plurality of control signals and the plurality of enable signals.

17. The integrated circuit of claim 12, wherein the plurality of control signals is user-programmable.

18. The integrated circuit of claim 12, wherein the plurality of enable signals is stored in programmable memory.

19. The integrated circuit of claim 18, wherein the plurality of control signals is stored in the programmable memory.

* * * * *